United States Patent
Lin

(10) Patent No.: US 8,046,644 B2
(45) Date of Patent: Oct. 25, 2011

(54) DRAM TESTING METHOD

(75) Inventor: Jin-Hue Lin, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 83 days.

(21) Appl. No.: 12/641,511

(22) Filed: Dec. 18, 2009

(65) Prior Publication Data

US 2011/0087935 A1    Apr. 14, 2011

(30) Foreign Application Priority Data

Oct. 8, 2009 (CN) .......................... 2009 1 0308085

(51) Int. Cl.
- G06F 11/00 (2006.01)
- G11C 29/00 (2006.01)
- G11C 7/00 (2006.01)
- G01R 27/28 (2006.01)
- G01R 31/00 (2006.01)
- G01R 31/14 (2006.01)

(52) U.S. Cl. ....... 714/718; 714/6.32; 714/719; 365/201; 702/117; 702/119

(58) Field of Classification Search .................... None
See application file for complete search history.

(56) References Cited

U.S. PATENT DOCUMENTS

| | | | | |
|---|---|---|---|---|
| 4,028,667 A * | 6/1977 | Breslau et al. | ................ | 709/225 |
| 5,923,599 A * | 7/1999 | Hii et al. | ....................... | 365/201 |
| 6,707,313 B1 * | 3/2004 | Rohrbaugh et al. | ..... | 324/762.02 |
| 6,728,916 B2 * | 4/2004 | Chen et al. | ..................... | 714/733 |
| 6,769,081 B1 * | 7/2004 | Parulkar | ....................... | 714/733 |
| 7,073,100 B2 | 7/2006 | Chadwick et al. | | |
| 7,788,543 B2 * | 8/2010 | Chen | .............................. | 714/45 |
| 2002/0089887 A1 * | 7/2002 | Hii et al. | ....................... | 365/201 |
| 2005/0283566 A1 * | 12/2005 | Callaghan | ..................... | 711/104 |
| 2009/0100305 A1 * | 4/2009 | Jan et al. | ....................... | 714/733 |
| 2009/0125762 A1 * | 5/2009 | Wang | ............................ | 714/718 |

* cited by examiner

*Primary Examiner* — Jeffrey A Gaffin
*Assistant Examiner* — Guerrier Merant
(74) *Attorney, Agent, or Firm* — Altis Law Group, Inc.

(57) ABSTRACT

A method for testing a dynamic random access memory (DRAM) includes copying a test program from the DRAM to a random access memory (RAM). Start and end physical addresses of the DRAM are respectively stored in first and second registers. First test data is written to the start physical address, and second test data is read from the start physical address. The method further includes determining whether the second test data is the same as the first test data. A fixed value is added to the start physical address to obtain a next start physical address if the second test data is the same as the first test data. The method further includes determining whether the next start physical address is less than the end physical address. A test success result is returned if the next start physical address is not less than the end physical address.

2 Claims, 3 Drawing Sheets

DRAM TESTING METHOD

BACKGROUND

1. Technical Field

Embodiments of the present disclosure relate to network testing, and more particularly to a method for testing dynamic random access memory (DRAM).

2. Description of Related Art

Generally, electronic components of a device must be self-tested in a product line before release. Such testing can include a test of a dynamic random access memory (DRAM) mounted on the electronic device to assure the quality of the DRAM.

Presently, the DRAM is tested by a test program stored in a specific memory location of the DRAM, so the specific memory location of the DRAM storing the test program cannot be tested. Therefore, the test result of the DRAM may be inaccurate.

BRIEF DESCRIPTION OF THE DRAWINGS

The details of the disclosure, both as to its structure and operation, can best be understood by referring to the accompanying drawings, in which like reference numbers and designations refer to like elements.

DETAILED DESCRIPTION

Figure 1:
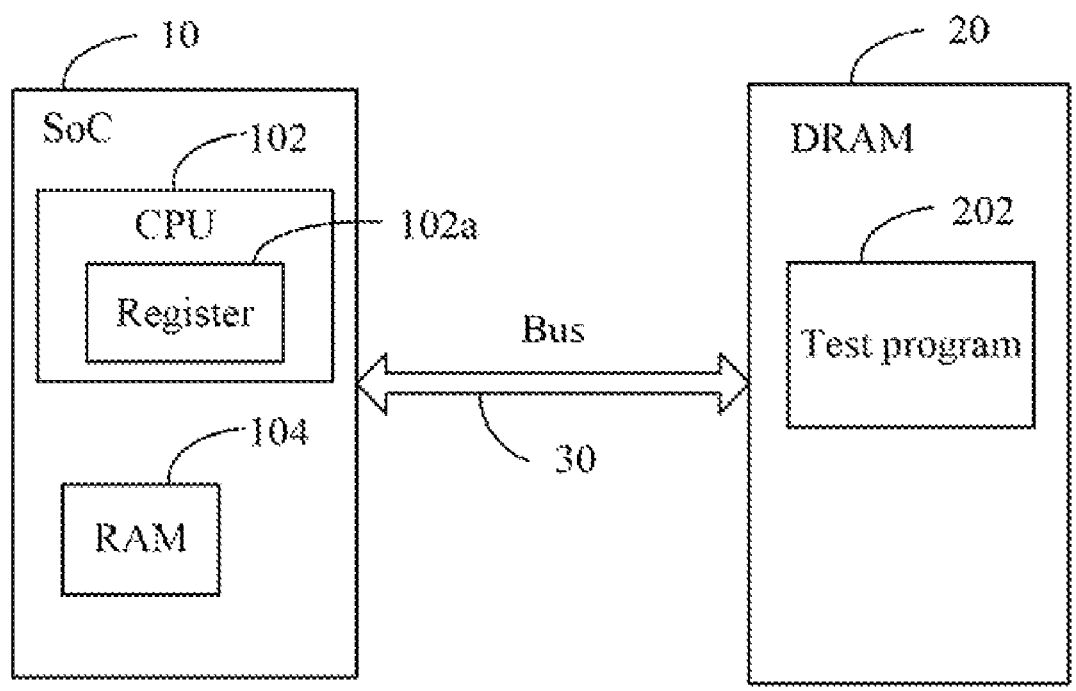
FIG. 1 is a schematic diagram of an application environment of a method for testing a dynamic random access memory (DRAM) in accordance with the present disclosure.

FIG. 1 is a schematic diagram of an application environment of a method for testing a dynamic random access memory (DRAM) 20 in accordance with the present disclosure. In one non-limiting example, an electronic device can use the method to self-test an on-board DRAM. In one embodiment, a system on chip (SoC) 10 communicates with the DRAM 20 over a bus 30. The SoC 10 includes a central processing unit (CPU) 102 and a random access memory (RAM) 104. The DRAM 20 is positioned externally from the SoC 10, and stores a test program 202. The CPU 102 includes a plurality of registers 102a, such as a first register, a second register, a third register, a fourth register, and a fifth register. All memory locations (e.g., memory addresses) of the DRAM 20 can be accurately tested by the CPU 102 and the RAM 104 of the SoC 10.

Figure 2:
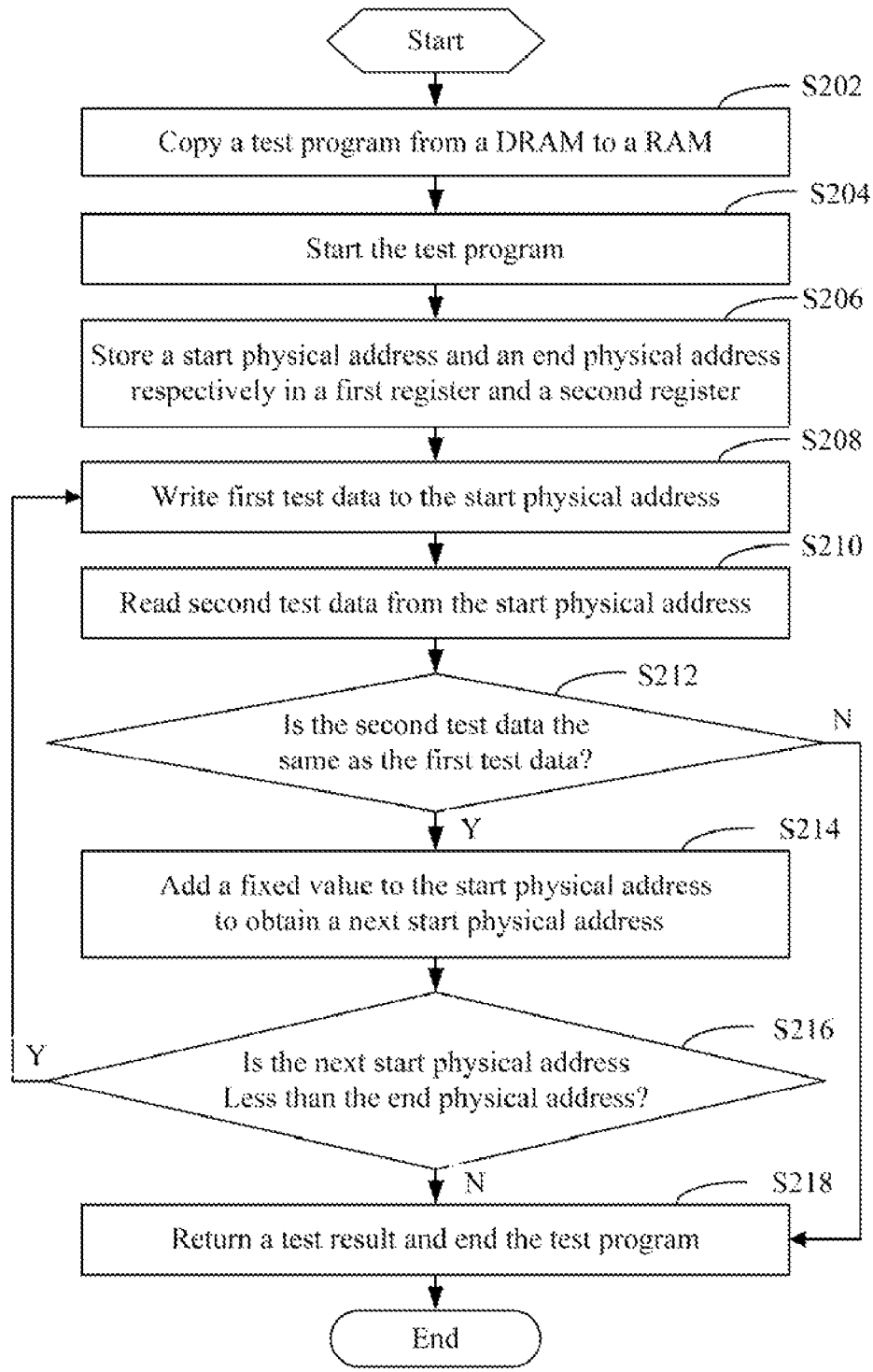
FIG. 2 is a flowchart of one embodiment of a DRAM testing method in accordance with the present disclosure.

FIG. 2 is a flowchart of one embodiment of the method for testing the DRAM in accordance with the present disclosure. Depending on the embodiment, additional blocks may be added, others may be deleted, and the ordering of the blocks may be changed.

Figure 3:
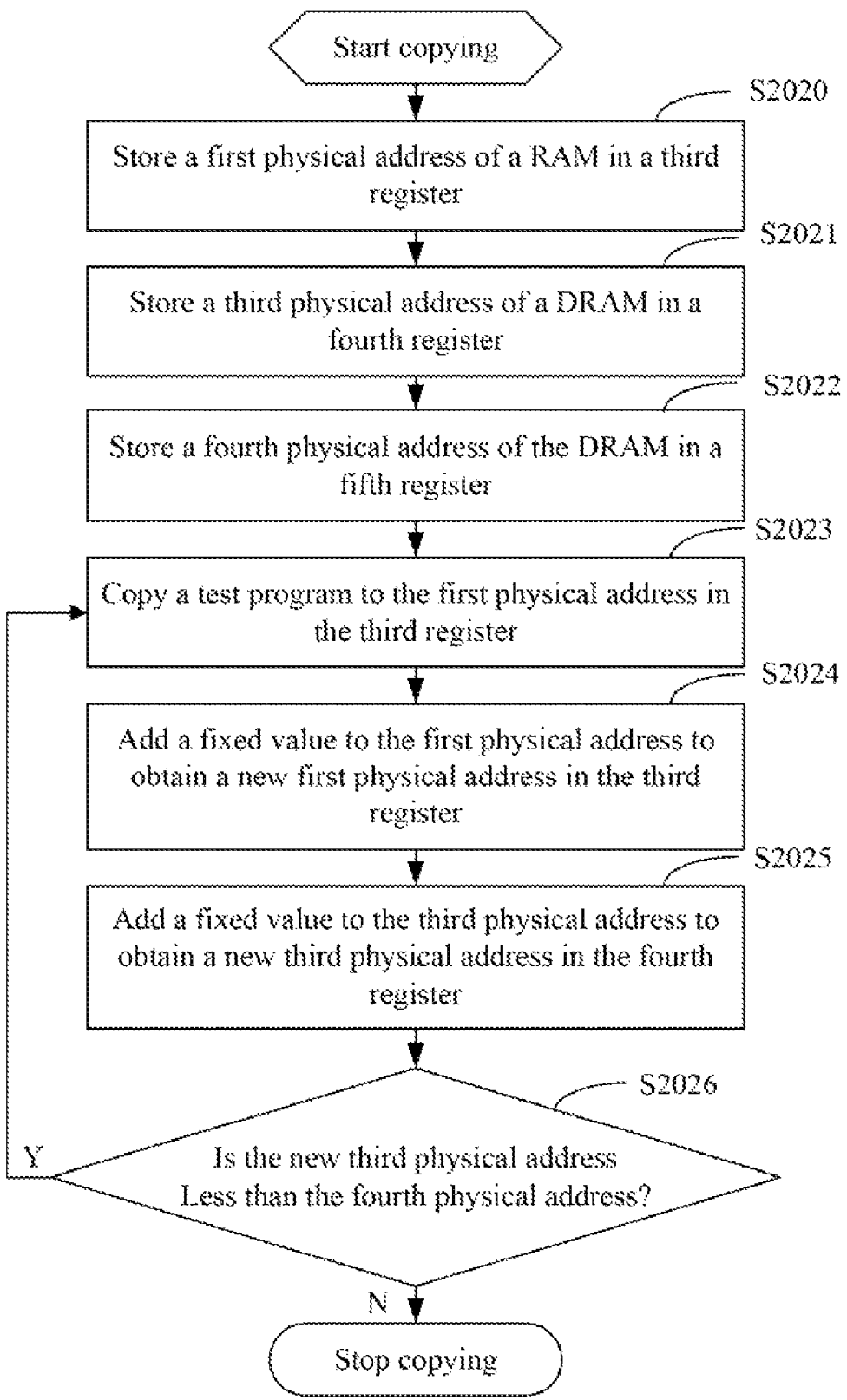
FIG. 3 is a detailed flowchart of block S202 of the method of FIG. 2.

In block S202, the test program 202 is copied from the DRAM 20 to the RAM 104, as detailed in FIG. 3.

In block S204, the test program 202 in the RAM 104 is started. The test program 202 may be started by execution of a jump instruction corresponding to a start location of the test program 202. In one embodiment, the CPU 102 executes a boot loader when booting up, and determines whether the DRAM 20 is to be tested via the boot loader. The test program 202 will be started if the DRAM 20 is to be tested. Simultaneously, a return address of the boot loader is stored in a stack of the DRAM 20 by a push instruction in order to return to the boot loader after the DRAM 20 testing.

In block S206, a start physical address and an end physical address of the DRAM 20 are stored in a first register and a second register of the CPU 102, respectively.

In block S208, first test data is written to the start physical address of the DRAM 20 in the first register of the CPU 102. In one embodiment, the start physical address of the DRAM 20 in the first register of the CPU 102 is loaded to another register to back up the start physical address of the DRAM 20 before the first test data is written. The first test data may be a hexadecimal number such as A5A5A5A5, or a binary number such as 101010.

In block S210, a second test data is read from the start physical address of the DRAM 20.

In block S212, the CPU 102 determines whether the second test data is the same as the first test data.

If the second test data is the same as the first test data, in block S214, a fixed value is added to the start physical address of the DRAM 20 to obtain a next start physical address of the DRAM 20. In one embodiment, the fixed value is 4.

If the second test data is different from the first test data, testing has failed. In block S218, a test failure result is returned, and the test program 202 is ended.

In block S216, the CPU 102 determines whether the next start physical address of the DRAM 20 is less than the end physical address of the DRAM 20 in the second register of the CPU 102.

If the next start physical address of the DRAM 20 is less than the end physical address of the DRAM 20 in the second register of the CPU 102, block S208 is repeated and the first test data is written to the next start physical address of the DRAM 20.

If the next start physical address of the DRAM 20 is not less than the end physical address of the DRAM 20 in the second register of the CPU 102, the test of the DRAM 20 is complete. In block S218, a test success result is returned, and the test program 202 is ended. In one embodiment, the return address is read from the stack of the DRAM 20 by a POP instruction after the test success result is returned. Then the program goes back to the boot loader via a JUMP instruction and the return address. That is, the test program is ended.

FIG. 3 is a detailed flowchart of block S202 of the method of FIG. 2. In one embodiment, an available memory location of the RAM 104 is between a first physical address and a second physical address, and the test program 202 is stored in the DRAM 20 between a third physical address and a fourth physical address.

In block S2020, the first physical address of the RAM 104 is stored in a third register of the CPU 102.

In block S2021, the third physical address of the DRAM 20 is stored in a fourth register of the CPU 102.

In block S2022, the fourth physical address of the DRAM 20 is stored in a fifth register of the CPU 102.

In block S2023, the test program 202 is copied to the first physical address in the third register of the CPU 102. In one embodiment, the test program 202 is copied 4 bytes by 4 bytes.

In block S2024, a fixed value is added to the first physical address in the third register of the CPU 102 to obtain a new first physical address in the third register.

In block S2025, the fixed value is added to the third physical address in the fourth register of the CPU 102 to obtain a new third physical address in the fourth register.

In block S2026, the CPU 102 determines whether the new third physical address in the fourth register is less than the fourth physical address in the fifth register.

If the new third physical address in the fourth register is less than the fourth physical address in the fifth register, going back to S2023, the test program is copied to the new first physical address in the third register.

If the new third physical address in the fourth register is not less than the fourth physical address in the fifth register, the process is ended.

Thus, the test program 202 is copied from the DRAM 20 outside the SoC 10 to the RAM 104 inside the SoC 10, and then written to and read from all memory locations of the DRAM 20 to provide thorough testing the DRAM 20. Therefore, all memory locations of the DRAM 20 are tested and accordingly the test result is accurate.

While various embodiments of the present disclosure have been described above, it should be understood that they have been presented using example only and not using limitation. Thus the breadth and scope of the present disclosure should not be limited by the above-described embodiments, but should be defined only in accordance with the following claims and their equivalents.

What is claimed is:

1. A method for testing a dynamic random access memory (DRAM) positioned externally from a system on chip (SoC), the SoC comprising a central processing unit (CPU) and a random access memory (RAM), the method comprising:
    copying a test program of the DRAM from the DRAM to the RAM;
    starting the test program in the RAM;
    storing a start physical address and an end physical address of the DRAM in a first register and a second register of the CPU, respectively;
    writing first test data to the start physical address of the DRAM in the first register of the CPU;
    reading second test data from the start physical address of the DRAM;
    determining whether the second test data is the same as the first test data;
    returning a test failure result and ending the test program if the second test data is not the same as the first test data; or
    adding a fixed value to the start physical address of the DRAM in the first register to obtain a next start physical address if the second test data is the same as the first test data;
    determining whether the next start physical address is less than the end physical address of the DRAM in the second register;
    writing the first test data to the next start physical address if the next start physical address is less than the end physical address of the DRAM in the second register, and repeating the reading and determining steps; or
    returning a test success result and ending the test program if the next start physical address is not less than the end physical address of the DRAM in the second register;
    wherein an available memory location of the RAM is between a first physical address and a second physical address of the RAM, and the test program is stored in the DRAM between a third physical address and a fourth physical address of the RAM;
    wherein the step of copying the test program of DRAM from the DRAM to the RAM comprises:
        storing the first physical address of the RAM in a third register of the CPU;
        storing the third physical address of the DRAM in a fourth register of the CPU;
        storing the fourth physical address of the DRAM in a fifth register of the CPU;
        copying the test program to the first physical address in the third register;
        adding the fixed value to the first physical address in the third register to obtain a new first physical address in the third register;
        adding the fixed value to the third physical address in the fourth register to obtain a new third physical address in the fourth register;
        determining whether the new third physical address in the fourth register is less than the fourth physical address in the fifth register;
        going on copying the test program to the new first physical address in the third register if the new third physical address in the fourth register is less than the fourth physical address in the fifth register; and
        stopping the copying block if the new third physical address in the fourth register is not less than the fourth physical address in the fifth register.

2. The method as claimed in claim 1, wherein the fixed value is 4.

* * * * *